United States Patent
Lee et al.

(10) Patent No.: US 6,362,033 B1
(45) Date of Patent: Mar. 26, 2002

(54) SELF-ALIGNED LDD FORMATION WITH ONE-STEP IMPLANTATION FOR TRANSISTOR FORMATION

(75) Inventors: Heon Lee, Sunnyvale, CA (US); Young-Jin Park, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/460,318

(22) Filed: Dec. 14, 1999

(51) Int. Cl.[7] ............... H01L 21/338; H01L 21/8238; H01L 21/28; H01L 21/44

(52) U.S. Cl. ............ 438/182; 438/230; 438/574; 438/579

(58) Field of Search ............... 438/182, 595, 438/531, 574, 579, 163, 230

(56) References Cited

U.S. PATENT DOCUMENTS

| | | | | |
|---|---|---|---|---|
| 4,198,250 A | * | 4/1980 | Jecmen | 148/1.5 |
| 4,394,182 A | * | 7/1983 | Maddox | 148/1.5 |
| 5,053,849 A | * | 10/1991 | Izawa et al. | 357/59 |
| 5,650,343 A | * | 7/1997 | Luning et al. | 437/36 |
| 5,741,736 A | * | 4/1998 | Orlowski et al. | 438/286 |
| 6,013,570 A | * | 1/2000 | Yu et al. | 438/595 |
| 6,140,218 A | * | 10/2000 | Liu et al. | 438/597 |

OTHER PUBLICATIONS

C.L. Chen et al., Effects of Implant Spacer on LnP–based self–aligned Psuedomorphic SIGFETs, Apr. 29, 1999, Electronics Letters, pp. 746–748.*

* cited by examiner

Primary Examiner—Richard Elms
Assistant Examiner—Adam J. Pyonin

(57) ABSTRACT

A method for forming a transistor is formed where a gate electrode of the transistor is formed over a substrate defining a gate channel portion of the substrate. A mask is also formed over the substrate, a portion of the mask extending over a first portion of the substrate adjacent to the gate channel portion of the substrate. The mask defines a second portion of the substrate adjacent to the first portion of the substrate. An ion beam is directed toward the substrate to form a drain or a source region of said transistor adjacent to the gate channel portion of the substrate, the source or drain region including the first and second portions of the substrate. The ion beam implants the second portion of the substrate with a first implantation characteristic. The ion beam passes through the extended portion of the mask to reach the first portion to implant the first portion with a second implantation characteristic, such second implantation characteristic being different from the first implantation characteristic.

25 Claims, 6 Drawing Sheets

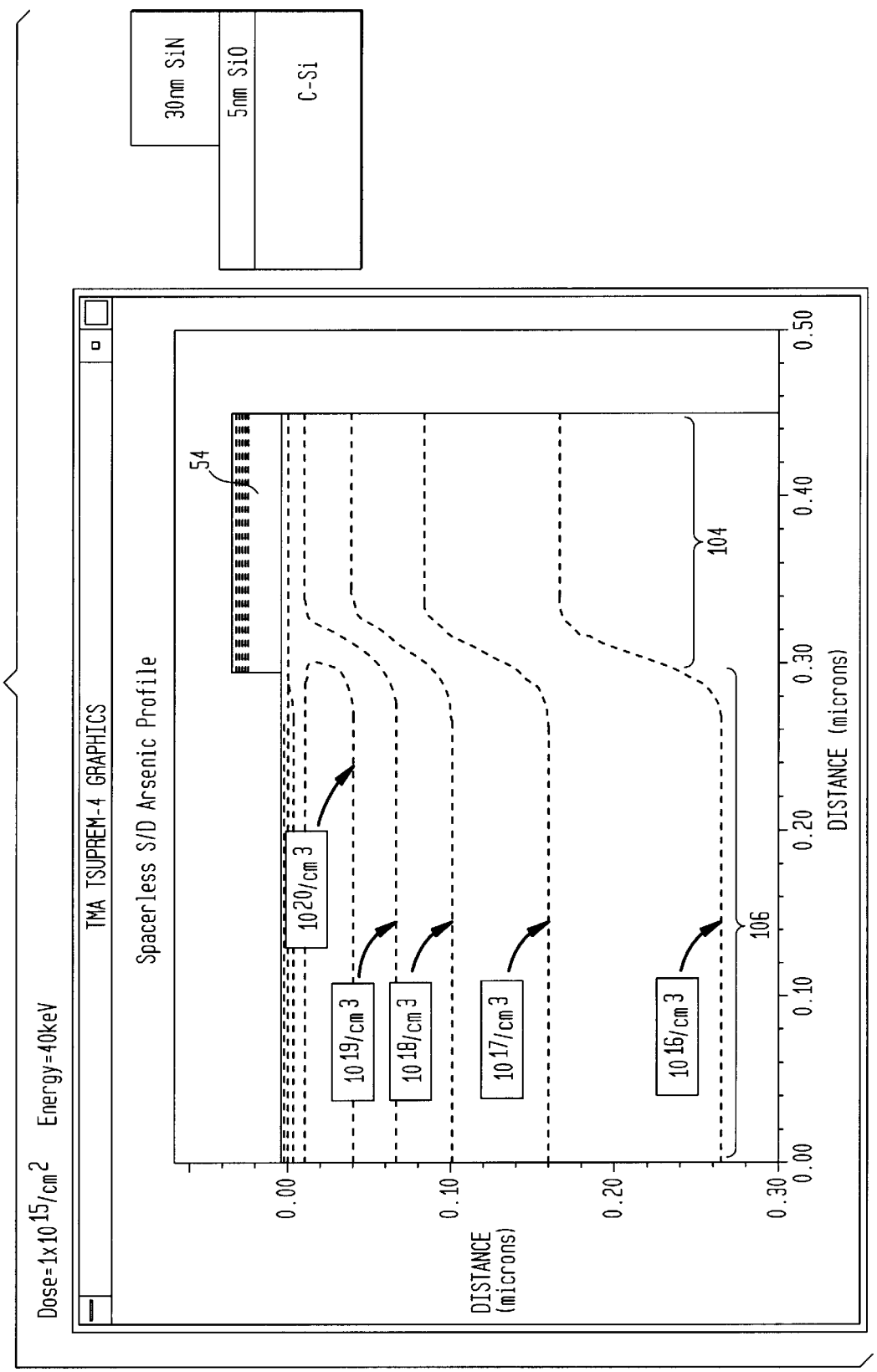

US 6,362,033 B1

SELF-ALIGNED LDD FORMATION WITH ONE-STEP IMPLANTATION FOR TRANSISTOR FORMATION

BACKGROUND OF THE INVENTION

This invention relates generally to integrated circuits and more particularly to methods for forming lightly doped source and drain regions (LDD) for MOS transistors.

Lightly doped source and drain regions (LDD) have proved advantageous for MOS transistors in highly integrated circuits. One technique for forming lightly doped drains is as follows. Referring to FIG. 1A, a silicon substrate 10 is provided on which field oxide regions 12 are formed. Field oxide regions 12 define an active area in which a transistor 14 is formed. Note that shallow trench isolation may be used in place of field oxide regions 12. Transistor 14 includes a gate stack 16 and source and drain regions 18. Gate stack 16 includes a gate dielectric (gate oxide 20) formed over a gate channel region 22, a gate doped polycrystalline silicon layer 24 and an insulation cap 26. Source and drain regions 18 are formed by using gate stack 16 and field oxide regions 12 as a mask and implanting an appropriate dopant by a low energy ion beam to form shallow and lightly doped source and drain regions 18. The regions may have a depth of 500–700 Angstrom and a dose of approximately $10^{13}$–$10^{14}$ cm$^{-2}$ implanted at an ion acceleration voltage of 10 KeV and 10–15 KeV for $BF_2$, for example.

Because they are lightly doped, lightly doped source and drain regions 18 do not form satisfactory ohmic contacts with metal or doped poly-crystalline silicon interconnect layers, not shown. To provide for such an ohmic contact, highly doped regions are formed in source and drain regions 18 of transistor 14, and the interconnect layers connect to those highly doped regions. Hence, referring to FIG. 1B, after forming source and drain regions 18, dielectric spacers 28 are formed by a conventional process on all sides of gate stack 16 thereby insulating gate conductor 24. The entire structure is then subjected to a second ion implantation process using a high dose, high energy ion beam to form the highly doped regions 30 and, in addition, doped regions 31 under the sidewall spacers 16, as indicated. After annealing highly doped region 30 to activate the implanted dopants, the width of the channel region under the gate is reduced to the width indicated by $L_{effective}$. Note that $L_{effective}$ is typically narrower than the width of the gate because of out-diffusion of dopant in regions 31 into portions 32 of the channel region, such out-diffusion being indicated by the dotted line in FIG. 1B.

Referring to FIG. 1C, highly doped regions 30 are then used for forming interconnect layer contacts to the source and drain regions 18, such as metal, or doped polycrystalline silicon, contact 32 formed by any conventional process. At the point of contact of metal layer 32 with highly dope region 30, a silicide layer may be formed to improve contact between metal contact 32 and highly doped region 30. As is obvious, this process requires two ion implantation procedures to form lightly doped source or drain regions having satisfactory ohmic contacts.

SUMMARY OF THE INVENTION

In one general aspect, the invention features a method for forming a transistor. A gate electrode of a transistor is formed over a substrate. The gate electrode defines a gate channel portion of the substrate. A mask is also formed over the substrate, a portion of the mask extending over a first portion of the substrate adjacent to the gate channel portion of the substrate. The mask defines a second portion of the substrate adjacent to the first portion of the substrate. An ion beam is directed toward the substrate to form a drain or a source region of the transistor adjacent to the gate channel portion of the substrate, the source or drain region including the first and second portions of the substrate. The ion beam implants the second portion of the substrate with a first implantation characteristic. The ion beam passes through the extended portion of the mask to reach the first portion to implant the first portion with a second implantation characteristic, such second implantation characteristic being different from the first implantation characteristic.

In another general aspect, the invention features a method for forming a transistor. A gate stack is formed where the gate stack includes a gate oxide layer, a gate conductive layer, and a gate insulation layer. The gate stack is subjected to an etch to laterally remove portions of the gate conductive layer to undercut a portion of the insulating layer. The etched conductive layer forms a gate conductor defining a gate channel portion of the substrate. The undercut portion of the insulating layer extends beyond the gate conductor to provide an overhang over a first portion of the substrate adjacent to the gate channel portion of the substrate. An ion beam is directed toward the substrate to form a source or drain region of the transistor adjacent to the gate channel portion of the substrate. The source or drain region includes the first portion of the substrate and a second potion of the substrate adjacent to the first portion of the substrate. The ion beam implants the second portion with a first implantation characteristic. The ion beam also passes through the undercut portion of the insulating layer to reach the first portion to implant the first portion with a second implantation characteristic, such second implantation characteristic being different from the first implantation characteristic.

Hence, these aspects of the invention allow for forming an implanted region having two different implantation characteristics during a single implantation step.

Preferred embodiments of the invention may include one or more of the following features.

The first and second implantation characteristics can be first and second dosage concentrations, respectively, where the first dosage concentration is greater than the second dosage concentration. The extended portion of the mask changes characteristics of the ion beam passing therethrough to reduce the dosage concentration implanted by the ion beam in the first portion of the substrate to the second dosage concentration. The extended portion of the mask reduces the current of the ion beam.

The first and second implantation characteristics can also be first and second implantation depths, respectively, where the first implantation depth is greater than the second implantation depth. The extended portion of the mask changes characteristics of the ion beam passing therethrough to reduce the implantation depth of dopants implanted in the first portion of the substrate to the second implantation depth. The extended portion of the mask reduces the voltage of the ion beam so that the penetrating depth of the ion beam passed through the over-hang region is reduced.

The extended portion of the mask can also change other characteristics of the ion beam passing therethrough, such as the angle of incidence of the ion beam with the substrate.

The gate stack is formed by forming a gate oxide layer on a surface of the substrate; forming a conductive layer over the gate oxide layer; depositing an insulating layer over the conductive layer, the insulating layer being selected to change characteristic of an ion beam passing through the insulating layer; and patterning the conductive layer and the insulating layer into a gate stack extending vertically with respect to the substrate.

The mask defines an opening over the second portion. The insulating layer is deposited by depositing the insulating layer with a thickness selected to change characteristics of the ion beam passing therethrough such that the ion implantation in the first portion of the substrate has the second implantation characteristic. The conductive layer is a poly-crystalline silicon layer, typically a polysilicon etch selective to silicon oxide or silicon nitride. The etch is an isotropic etch such as a chemical downstream etch (CDE) using an HBr based plasma or a wet etch using an $HNO_3$ and HF solution.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will become apparent from the following description of preferred embodiments, including the drawings, and from the claims.

BRIEF DESCRIPTION OF THE DRAWINGS

FIGS. 3A–3B are graphs of results of simulation of fabrication techniques in accordance with the invention.

DESCRIPTION OF THE PREFERRED EMBODIMENTS

Figure 2A:
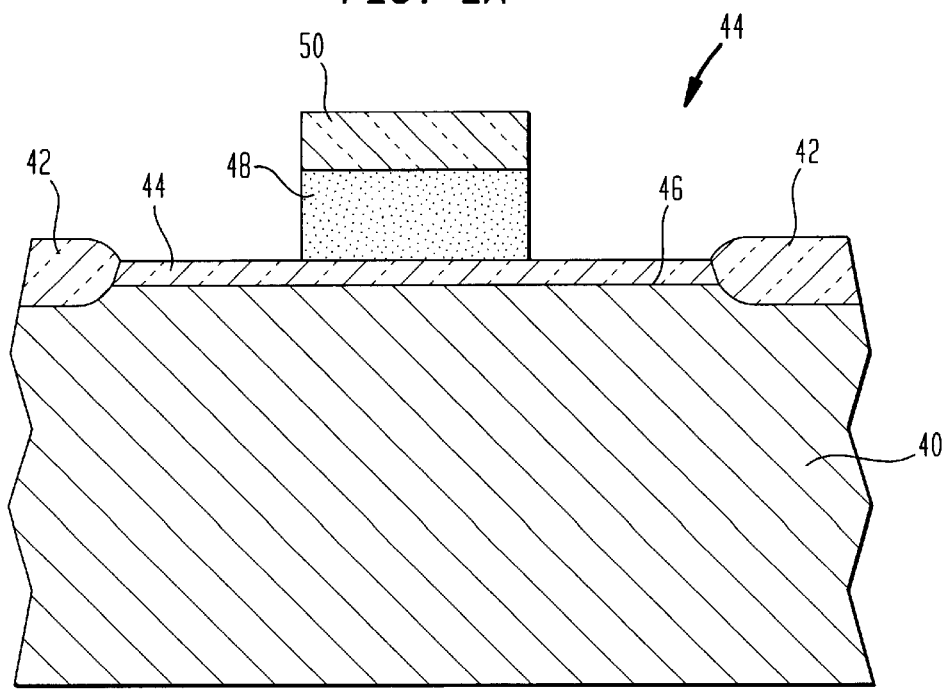
FIGS. 2A–2E are cross-sectional diagrammatical sketches of a MOS transistor at various stages in the fabrication thereof in accordance with the invention.

Referring to FIG. 2A, a single crystal semiconductor body, here a silicon substrate 40, is shown. Substrate 40 has filed oxide regions 42 (or alternatively, STI regions) formed thereon to define an active transistor region for forming a transistor 63 (as shown in FIGS. 2C–E). A dielectric layer 44 of silicon dioxide, here about 40–80 Angstroms thick, is thermally grown over an upper surface 46 of substrate 10. A gate conductor 48 and a gate insulation cap 50 are formed over gate dielectric layer 44. Here, to do so, a poly-crystalline doped layer and a silicon nitrite insulation layer are deposited over the entire structure. These layers are then patterned, for example, by a conventional photolithography process for patterning a hard mask such as a TEOS or BSG mask (not shown) followed by a chemical etching technique such reactive ion etching (R.I.E.).

Figure 2B:
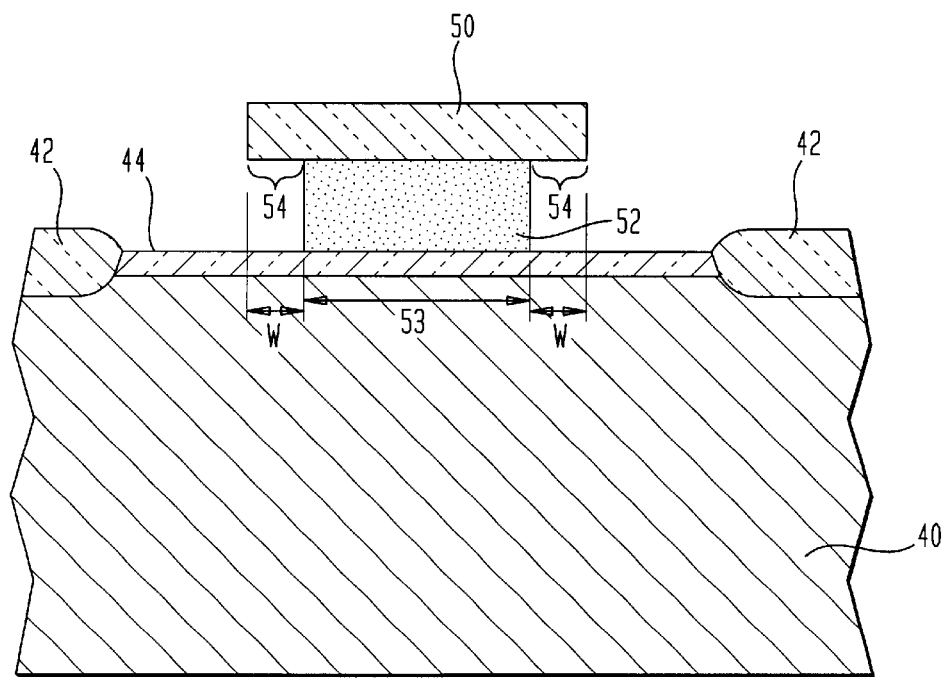
Figure 2C:
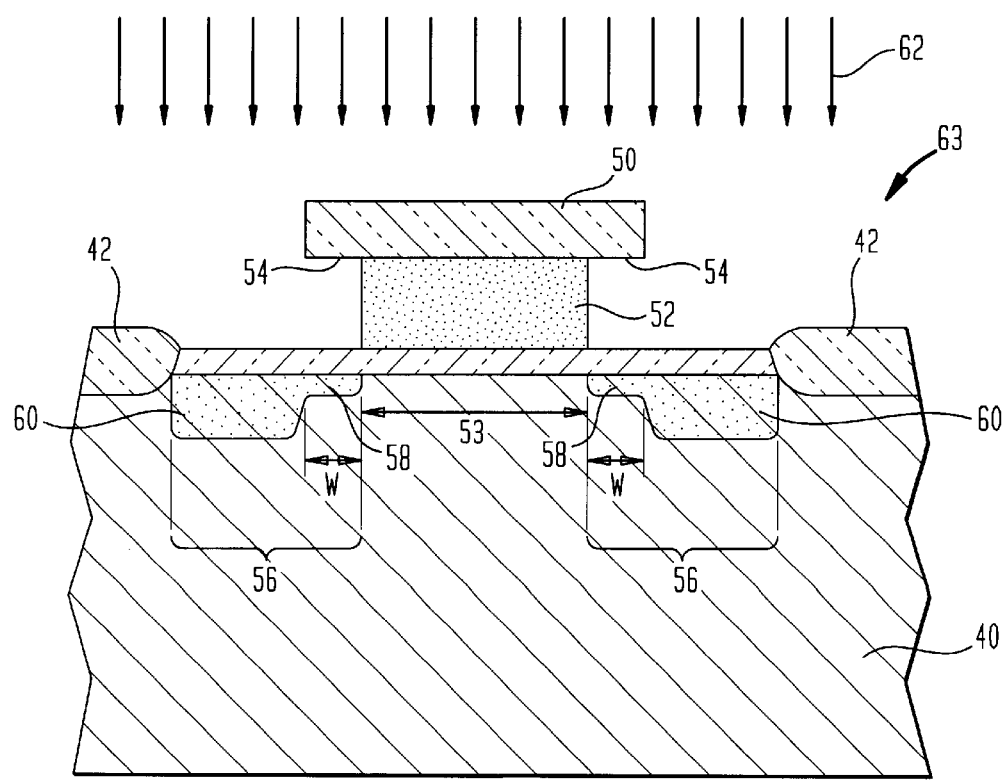
Figure 2D:
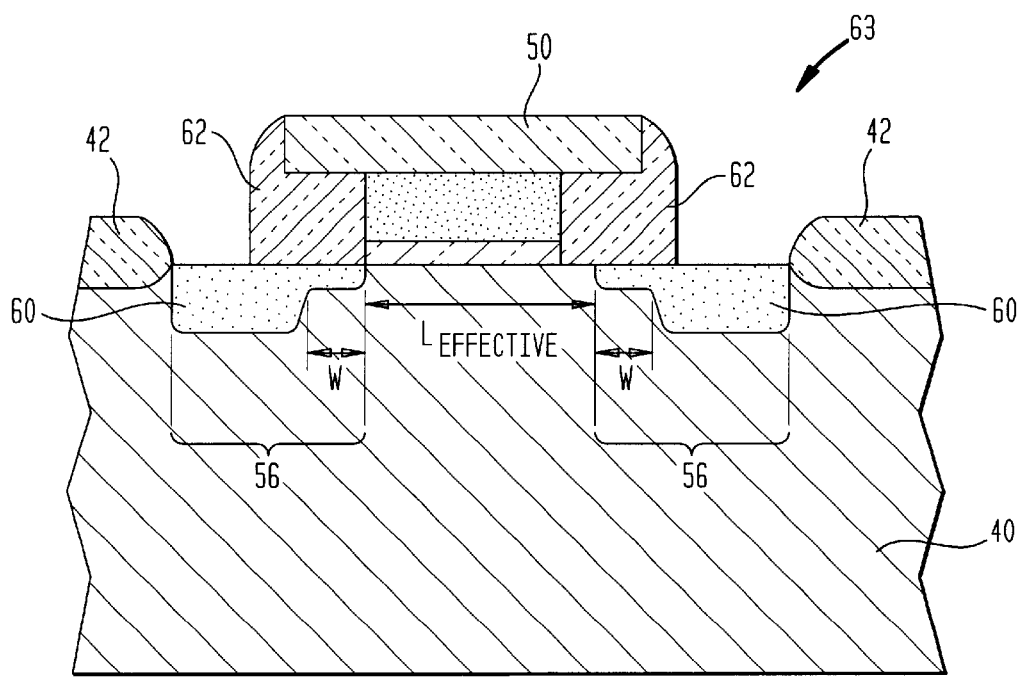
Figure 2E:
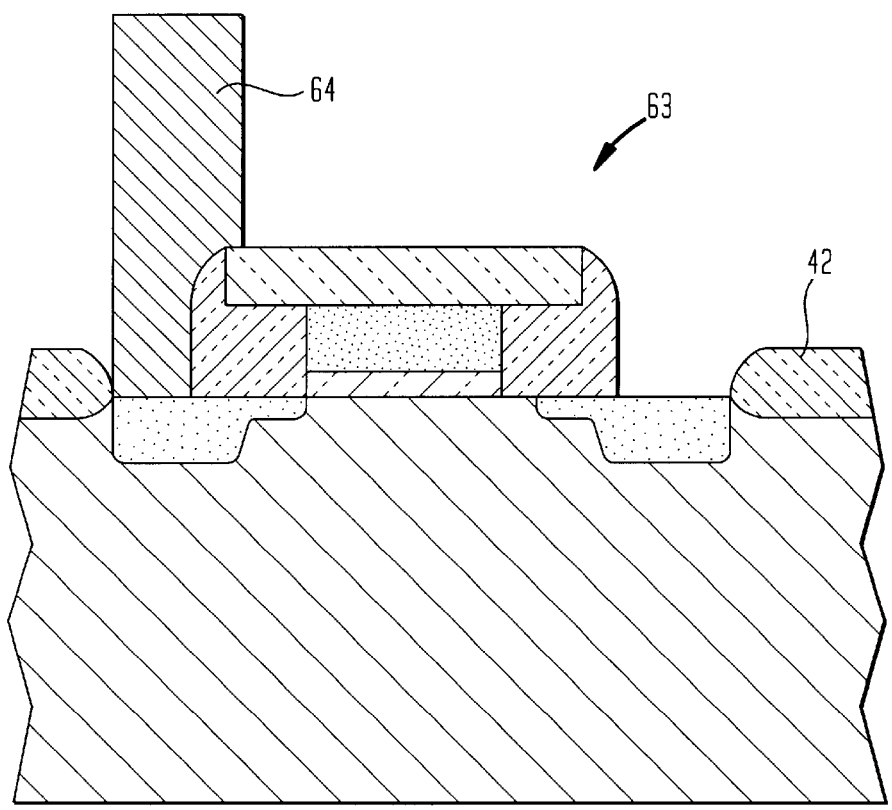

Referring to FIG. 2B, the structure in FIG. 2A is then subjected to an etchant which selectively does not etch silicon nitrite of insulation cap 50 and silicon dioxide of gate oxide 44, but etches poly-crystalline silicon of conductive layer 48 (FIG. 2A) to thereby form a gate conductor 52. Such an etchant may for example be an HBr based plasma used during a chemical downstream etch (CDE) process, or a solution of $HNO_3$ and HF or a solution of HF, $CH_3COOH$, and $HNO_3$ used during a wet etch process. The etchant laterally removes portions of conductive layer 48 (FIG. 2A) to thereby form, or pattern the conductive layer 48 into the gate electrode 52. The etchant undercuts insulation cap 50 to provide an undercut 54 over substrate 40.

Undercut portion 54 extends beyond patterned gate electrode 52 to provide an overhang vertically spaced from surface 46 of substrate 10 and disposed over portions of substrate 40 adjacent to gate channel portion 53 of substrate 40. Width W of undercut portion 54 is determined by the duration of the etching process and the etching rate of the etchant. Width W defines the width of the portion of substrate over which undercut portions 54 hangs (which, as seen in FIG. 2E, will be lightly doped source and drain regions), the width of gate electrode 52, and the width of gate channel 53, i.e., $L_{effective}$.

Referring to FIG. 2C, the structure is then subjected to a high voltage, high dose ion beam implantation process to implant a dopant indicated by arrows 62. For example, for n-type regions, arsenic (As) can be implanted at a dose of $5-50*10^{14}$ $cm^{-2}$ using a 30–40 keV beam. For p-type regions, $BF_2$ can be implanted at a dose of $5-50*10^{14}$ $cm^{-2}$ using a 30–40 keV beam, or phosphorous (P) at a dose of $5-50*10^{14}$ $cm^{-2}$ using a 5–10 keV beam. Each one of source and drain regions 56 has two portions. First portion 58 has a width substantially the same as width W of undercut portion 54 of gate insulation cap 50. Undercut portion 54 of gate insulation cap 50 acts as a filter with respect to ion beam 62 by absorbing some of the ions contacting it and allowing some of the other ions to pass through to be implanted in substrate 40. Undercut portion 54 also absorbs some of the energy of some of the ions passing therethrough and reduces the depth into which those ions are implanted.

Figure 1A:
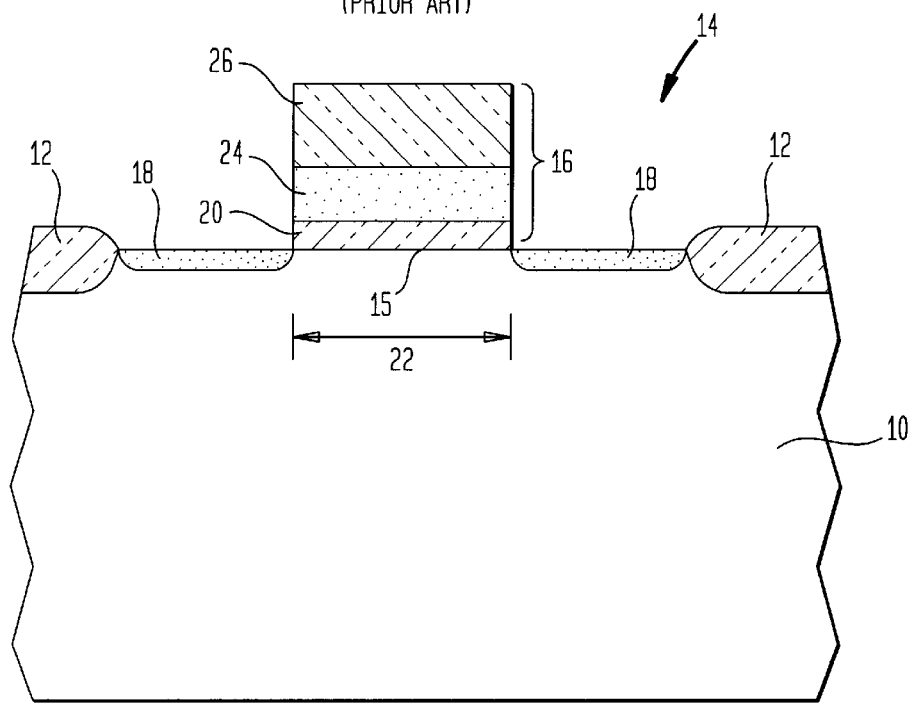
FIGS. 1A–1C are cross-sectional diagrammatical sketches of a MOS transistor at various stages of fabrication thereof in accordance with the PRIOR ART.
Figure 1B:
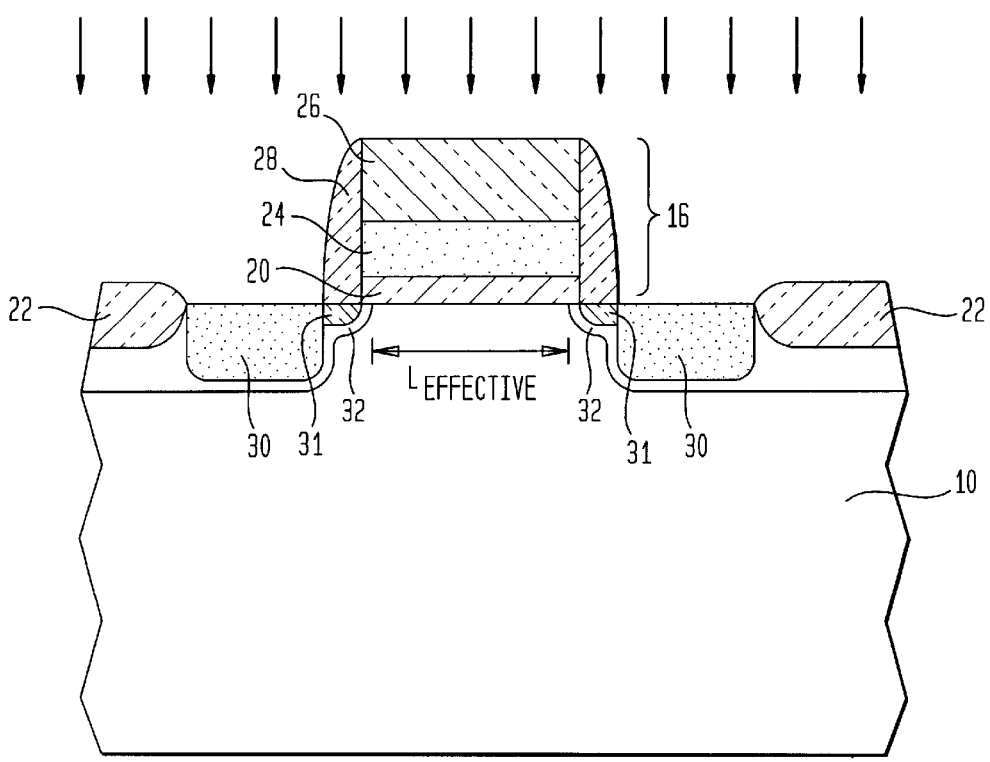
Figure 1C:
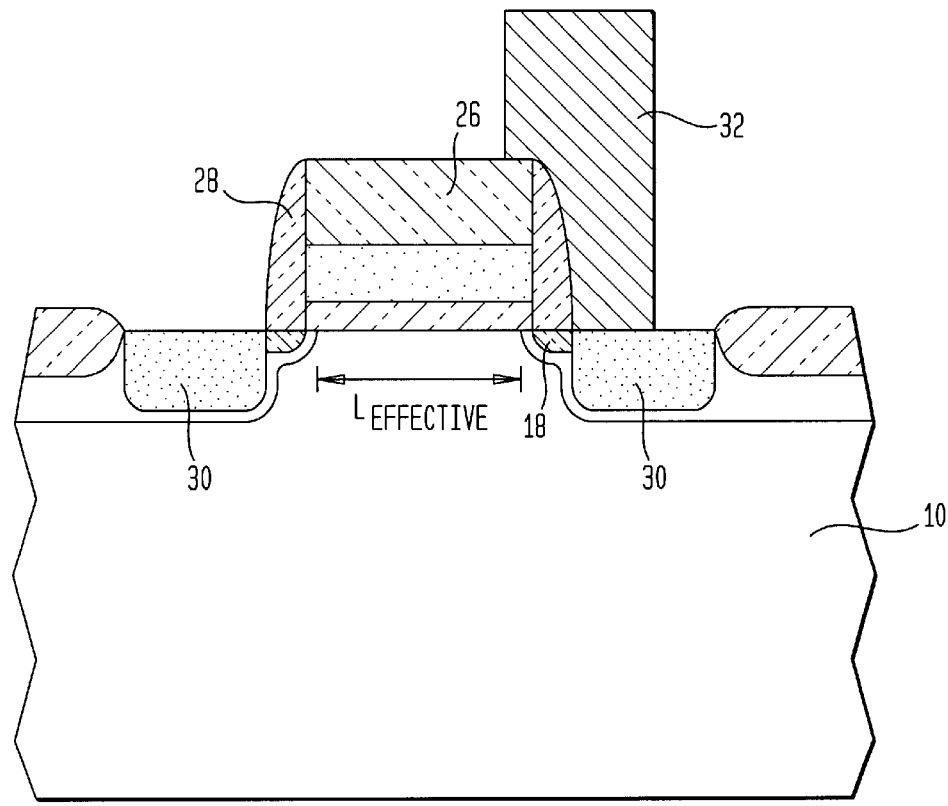

Hence, undercut portion 54 changes characteristics of the ion beam so as to cause portion 58 of substrate 48 underneath undercut portion 54 to be implanted at a first implantation characteristic different than the implantation characteristic of portion 60 of substrate 40. Therefore, after the implantation process, portion 58, which is located adjacent to gate channel region 53, will be shallower and more lightly doped than portion 60, which is spaced from gate channel region 53. The exact extent of the difference depends on the characteristics of the insulation cap 50, such its thickness and its chemical composition and structure. Portion 58 may have, for example, an approximate peak concentration of $10^{18}-10^{14}$ $cm^{-3}$, an approximate dosage of $10^{13}-10^{14}$ $cm^{-2}$ and an approximate depth of 500–700 Angstroms. In contrast, portion 60 may have, for example, an approximate peak concentration of $10^{19}-10^{20}$ $cm^{-3}$, an approximate dosage of $10^{13}-10^{14}$ $cm^{-2}$, and an approximate depth of 1500–2500 Angstroms. Therefore, by a single implantation step, an implantation profile for each one of regions 56 of transistor 63 is obtained that is similar implantation profiles obtained by using two implantation steps in the prior art fabrication technique shown in FIGS. 1A–1C.

Figure 3A:
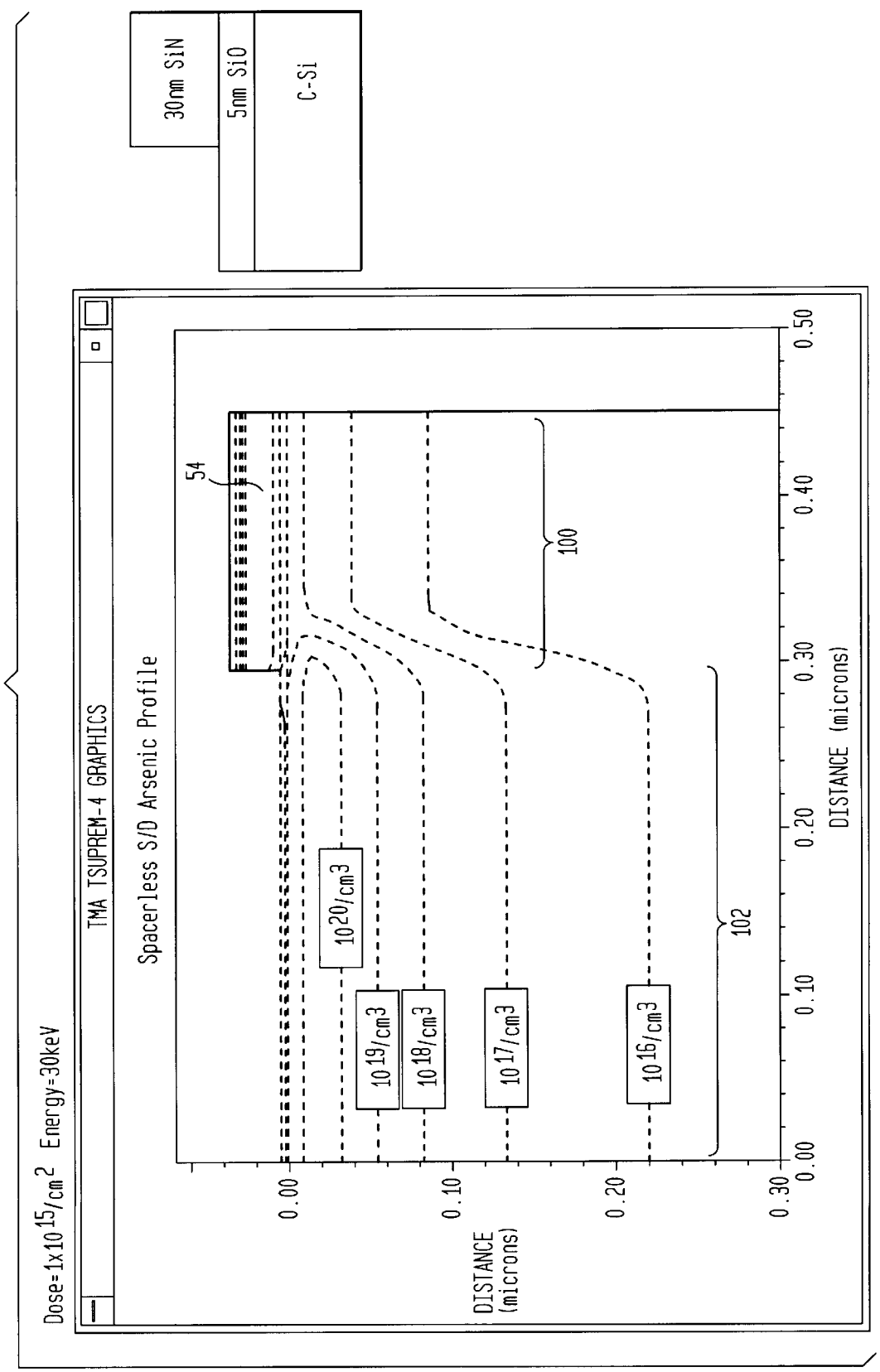

Referring to FIGS. 3A–3B, two simulations were performed on semiconductor fabrication simulation software marketed under the trade name TSUPREM by Technology Modeling Association, Inc., (special edition for IBM). FIGS. 3A and 3B show results of these simulation. The simulation in FIG. 3A assumed an ion beam of 30 keV and having a dose of $10^{15}$ per $cm^2$. It also assumed that the silicon dioxide layer over the substrate has a thickness of 5 nm, and that undercut portion 54 of silicon nitrite cap 50 has a thickness of 30 nm. As is readily apparent from FIG. 3A, area 100 under undercut portion 54 was implanted more shallow and at a lesser dose than area 102 adjacent to area 100.

For example, from the surface to a depth of about 0.06 microns, the simulation shows an implantation dose of $10^{19}$ per cm$^3$ and higher in area 102. However, in area 100, from about 0.01 micron to the surface, the implantation dose ranges from $10^{18}$ per cm$^3$ to less than $10^{19}$ per cm$^3$. At the same depth, the simulation results show an implantation dose of $10^{20}$ per cm$^3$ and higher—a factor of 100 difference—in area 102.

Similarly, in area 100 the implantation depth is less than the implantation depth in area 102. In area 100, a dose of $10^{18}$ per cm$^3$ is implanted at a depth of 0.01 micron while the same dose is implanted at a depth of more than 0.08 microns in area 102. A dose of $10^{17}$ per cm$^3$ is implanted in area 100 at a depth of about 0.05 microns while the same dose is implanted at a depth of more than 0.13 in area 102. A dose of $10^{16}$ per cm$^3$ is implanted at a depth of about 0.1 microns in area 100 while the same dose implanted at a depth of about 0.22 microns in area 102.

Referring FIG. 3B, similar results were for a 40 keV ion beam. Area 104 under undercut portion 54 was implanted more shallow and at a lesser dose than area 106 adjacent to area 104. For example, from the surface to a depth of about 0.07 microns, the simulation shows an implantation dose of $10^{19}$ per cm$^3$ and higher in area 106. However, in area 104, from about 0.07 micron to the surface, the implantation dose ranges from between $10^{17}$ per cm$^3$ to $10^{18}$ per cm$^3$ to about $10^{19}$ per cm$^3$ to $10^{20}$ per cm$^3$.

Similarly, in area 104 the implantation depth is less than the implantation depth in area 106. In area 104, a dose of $10^{19}$ per cm$^3$ is implanted at a depth of 0.01 micron while the same dose is implanted at a depth of about 0.07 microns in area 106. A dose of $10^{17}$ per cm$^3$ is implanted in area 104 at a depth of about 0.1 microns while the same dose is implanted at a depth of about 0.16 in area 106. A dose of $10^{16}$ per cm$^3$ is implanted at a depth of about 0.18 microns in area 104 while the same dose implanted at a depth of about 0.28 microns in area 102.

Referring to FIG. 2D, dielectric spacers 62, here silicon nitride (Si3N4) spacers, are next formed by a conventional process to insulate gate conductor 52 on all sides. To do so, a dielectric layer, here silicon nitride, is next deposited over the entire structure and then etched, for example, by a conventional photolithography process for patterning a hard mask such as a TEOS or BSG mask (not shown) followed by a chemical etching technique such reactive ion etching (R.I.E.). Referring to FIG. 2E, a metal or poly-crystalline contact 64 can then be formed using conventional techniques to connect to high dose areas 60. To do so, for example, a dielectric material, such as Borophosphosilicate Glass (BPSG) is deposited over the structure and planarized by a conventional chemical mechanical polishing process or etch back process. The dielectric material is then selectively etched to provide space for forming contact 64.

Other embodiments are within the scope of the following claims.

For example, undercut portion 54 may be formed from material that changes other characteristics of ion beam 42 to form source and drain regions 60 having two implanted regions, each with a different implantation characteristic. For example, undercut portion 54 may change the angle of incidence of ion beam 42 with the substrate.

It is to be understood that while the invention has been described in conjunction with the detailed description thereof, the foregoing description is intended to illustrate and not limit the scope of the invention, which is defined by the scope of the appended claims. Other aspects, advantages, and embodiments are within the scope of the following claims.

What is claimed is:

1. A method for forming a transistor, comprising:

providing a substrate;

forming a gate stack comprising a gate oxide layer, a gate conductive layer, and a gate insulating layer on the substrate, subjecting the gate stack to an etch to laterally remove portions of the gate conductive layer to undercut a portion of the insulating layer, the etched conductive layer forming a gate conductor being disposed over a gate channel portion of the transistor, the undercut portion of the insulating layer extending beyond the gate conductor to provide an overhang over a first portion of the substrate adjacent to the gate channel portion of the transistor, and directing an ion beam toward the substrate to form a drain region of said transistor adjacent to the gate channel portion of the transistor, the drain region including the first portion of the substrate and a second potion of the substrate adjacent to the first portion of the substrate, the ion beam implanting the second portion with a first implantation characteristic, and the ion beam passing through the undercut portion of the insulating layer to reach the first portion to implant the first portion with a second implantation characteristic, such second implantation characteristic being different from the first implantation characteristic;

forming insulating spacers on sidewalls of the insulating layer, portions of such insulating spacers extending under the overhanging portion of the insulating layer onto sidewalls of the etched conductive layer, other portions of the insulating spacers being disposed over the entire first portion of the substrate with portions of the second portion of the substrate being uncovered by the insulating spacers; and forming an electrical conductor on at least one of the insulating spacers, such electrical conductor being disposed over the uncovered portion of the second portion of the substrate.

2. The method of claim 1 wherein forming the gate stack comprises:

forming a gate oxide layer on a surface of the substrate;

forming a conductive layer over the gate oxide layer;

depositing an insulating layer over the conductive layer, the insulating layer being selected to change characteristic of an ion beam passing through the insulating layer;

patterning the conductive layer into a gate stack extending vertically with respect to the substrate.

3. The method of claim 1 wherein depositing the insulating layer further includes depositing the insulating layer with a thickness selected to change characteristics of the ion beam passing therethrough such that the ion implantation in the first portion of the substrate has the second implantation characteristic.

4. The method of claim 1 wherein the conductive layer is a poly-crystalline silicon layer.

5. The method of claim 1 wherein subjecting the gate stack to an etch comprises subjecting the substrate to an isotropic etch.

6. The method of claim 5 wherein the isotropic etch is a chemical downstream etch (CDE).

7. The method of claim 5 wherein the isotropic etch is a wet etch.

8. The method of claim 1 wherein a mask defines an opening over the second portion.

9. The method of claim 1 wherein the first and second implantation characteristics are first and second dosage concentrations, respectively.

10. The method of claim 9 wherein the first dosage concentration is greater than the second dosage concentration.

11. The method of claim 10 wherein the undercut portion of the insulating layer changes characteristics of the ion beam passing therethrough to reduce the dosage concentration implanted by the ion beam in the first portion of the substrate to the second dosage concentration.

12. The method of claim 10 wherein the undercut portion of the insulating layer reduces the current of the ion beam.

13. The method of claim 1 wherein the first and second implantation characteristics, are first and second implantation depths respectively.

14. The method of claim 13 wherein the first implantation depth is greater than the second implantation depth.

15. The method of claim 14 wherein the undercut portion of the insulating layer changes characteristics of the ion passing therethrough to reduce the implantation depth of dopants implanted in the first portion of the substrate to the second implantation depth.

16. The method of claim 14 wherein the undercut portion of the insulating layer reduces the voltage of the ion beam.

17. The method of claim 1 wherein the undercut portion of the insulating layer changes characteristics of the ion beam passing therethrough.

18. The method of claim 17 wherein the undercut portion of the insulating layer selectively changes the angle of incidence of the ion beam with the substrate forming the first and second implantation characteristics.

19. The method of claim 1 further comprising forming a capacitor having two electrodes, one of the electrodes being connected to the drain region.

20. The method of claim 19 wherein forming a capacitor comprises forming a trench capacitor in the substrate.

21. A method for forming a transistor, comprising:
   providing a semiconductor substrate;
   forming a gate oxide layer on a surface of the substrate;
   forming a conductive layer over the gate oxide layer;
   depositing an insulating layer over the conductive layer, the insulating layer being selected to reduce dosage of a dopant implanted by an ion beam of selected characteristics passing through the insulating layer, said selected characteristics including a predetermined dosage of the dopant implanted by the ion beam in the substrate;
   patterning the conductive layer and the insulating layer into a gate stack extending vertically with respect to the substrate;
   subjecting the stack to an etch selectively removing laterally exposed portions to form a gate conductor of a selected width extending over a gate channel portion of the substrate, said etch undercutting a portion of the insulating layer, such undercut portion of the insulating layer extending beyond the gate conductor to provide an overhang vertically spaced from a surface of the substrate and disposed over first portions of the substrate adjacent to the gate channel portion of the substrate, and
   forming source and drain regions of said transistor in the substrate adjacent to the gate channel portion of the substrate by directing the ion beam toward the substrate,
      the source and drain regions including the first portions of the substrate, and second potions of the substrate adjacent to the first portions of the substrate and spaced from the gate channel portion,
      the ion beam passing through the undercut portions of the insulating layer to reach the first portions to implant the first portions, the undercut portions of the insulating layer reducing the dose of the dopant implanted by the ion beam in the first portions of the substrate to a dose less than the predetermined dose, and
      the ion beam implanting second potions with the dopant substantially at said predetermined dose;
   forming insulating spacers on sidewalls of the insulating layer, portions of such insulating spacers extending under the overhanging portion of the conductive layer onto sidewalls of the etched conductive layer, other portions of the insulating spacers being disposed over the entire first portion of the substrate with portions of the second portion of the substrate being uncovered by the insulating spacers; and
   forming an electrical conductor on at least one of the insulating spacers, such electrical conductor being disposed over the uncovered portion of the second portion of the substrate.

22. A method for forming a transistor, comprising:
   providing a semiconductor substrate;
   forming a gate oxide layer on a surface of the substrate;
   forming a doped poly-crystalline conductive layer over the gate oxide layer;
   depositing a silicon nitride (SiN) insulating layer of a selected thickness over the conductive layer, the thickness of the insulating layer being selected to reduce dosage of a dopant implanted by an ion beam of selected characteristics passing through the insulating layer by a predetermined ratio, said selected characteristics including a predetermined dosage of the dopant implanted by the ion beam in the substrate;
   patterning the conductive layer and the insulating layer into a gate stack extending vertically with respect to the substrate;
   subjecting the stack to an HBr based isotropic etch selectively removing laterally exposed portions of the patterned conductive layer to form a gate conductor of a selected width extending over a gate channel portion of the substrate, said etch undercutting a portion of the insulating layer to form a T-shaped structure, such undercut portion of the insulating layer extending beyond the gate conductor to provide an overhang vertically spaced from a surface of the substrate and disposed over first portions of the substrate adjacent to the gate channel portion of the substrate, and
   forming source and drain regions of said transistor in the substrate adjacent to the gate channel portion of the substrate by directing the ion beam toward the substrate,
      the source and drain regions including the first portions of the substrate, and second potions of the substrate adjacent to the first portions of the substrate and spaced from the gate channel portion,
      the ion beam passing through the undercut portions of the insulating layer to reach the first portions to implant the first portions, the undercut portions of the insulating layer reducing the dose of the dopant implanted by the ion beam in the first portions of the substrate to a dose less than the predetermined dose, and
      the ion beam implanting second potions with the dopant substantially at said predetermined dose;

forming insulating spacers on sidewalls of the insulating layer, portions of such insulating spacers extending under the overhanging portion of the conductive layer onto sidewalls of the etchedconductive layer, other portions of the insulating spacers being disposed over the entire first portion of the substrate with portions of the second portion of the substrate being uncovered by the insulating spacers; and forming an electrical conductor on at least one of the insulating spacers, such electrical conductor being disposed over the uncovered portion of the second portion of the substrate.

23. A method for forming a transistor, comprising:

providing a semiconductor substrate;

forming a gate oxide layer on a surface of the substrate;

forming a conductive layer over the gate oxide layer;

depositing an insulating layer over the conductive layer;

patterning the conductive layer and the insulating layer into a gate stack extending vertically with respect to the substrate;

subjecting the stack to an isotropic etch selectively removing laterally exposed portions of the patterned conductive layer forming a T-shaped structure to undercut a portion of the insulating layer, such etched conductive layer extending over a gate channel portion of the substrate, such undercut portion of the insulating layer extending beyond the etched conductive layer to provide an overhang vertically spaced from a first surface portion of the substrate and disposed over portions of the substrate adjacent to the gate channel portion of the substrate, directing an ion beam toward the substrate to implant a predetermined dose of a dopant in the substrate and to form the source and drain regions of said transistor in the substrate adjacent to the gate channel portion of the substrate, the undercut portions of the insulating layer reducing the dose of the dopant implanted in the portions of the substrate adjacent to the gate channel region, said source and drain regions comprising said portions of the substrate adjacent to the gate channel region and portions of the substrate spaced from the gate channel region and implanted at said predetermined dose;

forming insulating spacers on sidewalls of the insulating layer, portions of such insulating spacers extending under the overhanging portion of the conductive layer onto sidewalls of the etched gate conductor and other portions of the insulating spacers being disposed over the entire first portion of the substrate with portions of the source and drain regions being uncovered by the insulating spacers; and forming an electrical conductor on at least one of the insulating spacers, such electrical conductor being on electrical contact with at least one of the source and drain regions.

24. A method for forming a transistor, comprising:

providing a semiconductor substrate;

forming a gate electrode on the substrate, the gate electrode including:
a dielectric layer, a conductive layer, and a layer being semi-permeable to an ion beam, laterally etching the conductive layer so that a portion of the semi-permeable layer extends beyond the conductive layer and covers a portion of the substrate, directing the ion beam toward the substrate to implant a predetermined dose of a dopant in the substrate to form the source and drain regions of said transistor, whereby said extended portion reduces the dose of the dopant implanted in said covered portion of the substrate to provide a source or drain region comprising a region implanted at said predetermined dose and the covered region implanted at said reduced dose; and forming insulating spacers on sidewalls of the semi-permeable layer, portions of such insulating spacers extending onto sidewalls of the etched conductive layer and other portions of the insulating spacers being disposed over the entire covered portion of the substrate with portions of the source and drain regions being uncovered by the insulating spacers;

forming an electrical conductor on at least one of the insulating spacers, such electrical conductor being on electrical contact with at least one of the source and drain regions.

25. A method of manufacturing a transistor on a substrate comprising:

providing a substrate;

forming a gate electrode on the substrate, the gate electrode including a first dielectric layer, a conductive layer, and a second dielectric layer being semi-permeable to an ion beam, laterally etching the conductive layer until the width of the conductive layer is less than the width of the second dielectric layer by a selected amount, and subjecting the substrate to an ion beam for implanting a predetermined dose of a dopant in the substrate to form the source and drain regions;

forming insulating spacers on sidewalls of the semi-permeable layer, portions of such insulating spacers extending onto sidewalls of the etched conductive layer with portions of the source and drain regions being uncovered by the insulating spacers; and forming an electrical conductor on at least one of the insulating spacers, such electrical conductor being on electrical contact with at least one of the source and drain regions.

* * * * *